United States Patent
Roy et al.

(10) Patent No.: US 9,673,247 B2
(45) Date of Patent: Jun. 6, 2017

(54) IMAGE SENSOR

(71) Applicant: STMicroelectronics (Crolles 2) SAS, Crolles (FR)

(72) Inventors: Francois Roy, Seyssins (FR); Philippe Are, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/136,569

(22) Filed: Apr. 22, 2016

(65) Prior Publication Data

US 2017/0125474 A1  May 4, 2017

(30) Foreign Application Priority Data

Oct. 30, 2015  (FR) .................................... 15 60422

(51) Int. Cl.
*H01L 27/148* (2006.01)
*H01L 27/146* (2006.01)

(52) U.S. Cl.
CPC .... *H01L 27/14636* (2013.01); *H01L 27/1461* (2013.01); *H01L 27/14614* (2013.01); *H01L 27/14638* (2013.01); *H01L 27/14643* (2013.01)

(58) Field of Classification Search
CPC ................................................ H01L 27/14636
USPC .................................................. 257/225, 443
See application file for complete search history.

(56) References Cited

U.S. PATENT DOCUMENTS 8,513,761 B2  8/2013  Roy et al.
9,236,407 B2  1/2016  Roy et al.
2005/0069293 A1* 3/2005 Monoi .............. H01L 27/14603
    386/326
2009/0266973 A1  10/2009 Roy et al.
2012/0161213 A1  6/2012 Roy et al.
2014/0183685 A1* 7/2014 Roy ................... H01L 27/14603
    257/443
2015/0279878 A1* 10/2015 Ahmed .............. H01L 27/1463
    257/446
2015/0372031 A1  12/2015 Yoon et al.
(Continued)

FOREIGN PATENT DOCUMENTS

EP     2752878 A2    7/2014
JP     2010114461 A  5/2010

OTHER PUBLICATIONS

INPI Search Report and Written Opinion for FR 1560422 dated Jul. 5, 2016 (12 pages).

*Primary Examiner* — Igwe U Anya
(74) *Attorney, Agent, or Firm* — Gardere Wynne Sewell LLP

(57) ABSTRACT

An image sensor includes a control circuit and pixels. Each pixel includes: a photosensitive area, a substantially rectangular storage area adjacent to the photosensitive area, and a read area. First and second insulated vertical electrodes electrically connected to each other are positioned opposite each other and delimit the storage area. The first electrode extends between the storage area and the photosensitive area. The second electrode includes a bent extension opposite a first end of the first electrode, with the storage area emerging onto the photosensitive area on the side of the first end. The control circuit operates to apply a first voltage to the first and second electrodes to perform a charge transfer, and a second voltage to block said transfer.

20 Claims, 6 Drawing Sheets

(56) References Cited

U.S. PATENT DOCUMENTS

2016/0118432 A1\* 4/2016 Cazaux ............ H01L 27/14605
257/448

\* cited by examiner

IMAGE SENSOR

PRIORITY CLAIM

This application claims the priority benefit of French Application for Patent No. 1560422, filed on Oct. 30, 2015, the contents of which are hereby incorporated by reference.

TECHNICAL FIELD

The present disclosure relates to an image sensor comprising a plurality of pixels formed inside and on top of a semiconductor substrate. A sensor adapted to a so-called global shutter control mode is here more specifically considered.

BACKGROUND

In an image sensor adapted to a global shutter control, each pixel comprises a photosensitive area, a read area, and a storage area. The photogenerated charges accumulated during an integration phase in the photosensitive areas of all the sensor pixels are simultaneously transferred into the corresponding storage areas and a full image is then stored in all the sensor storage areas. The stored image may then be read, line by line, during the next integration phase. Pixel structures compatible with a global shutter control where insulated vertical electrodes enable to transfer charges from the photosensitive area to the storage area, and from the storage area to the read area, are taught by U.S. Pat. No. 9,236,407 (incorporated by reference).

FIGS. 1A to 1G are copies of FIGS. 3A to 3G of patent U.S. Pat. No. 9,236,407 illustrating an example of a pixel 200 formed inside and on top of a silicon semiconductor substrate 201. FIG. 1A shows this pixel in top view. FIGS. 1B to 1G are cross-section views respectively along planes B-B, C-C, D-D, E-E, F-F, and G-G of FIG. 1A.

Pixel 200 comprises a photosensitive area, an intermediate charge storage area, and a read area connected to a read and processing circuit.

Substrate 201 is lightly P-type doped (P−). The photosensitive area of pixel 200 comprises an N-type doped well 205, having a doping level N1, forming with substrate 201 the junction of a photodiode, or photosite, PD'. The storage area of the pixel comprises, juxtaposed to well 205, an N-type doped well 207, having a doping level N2 greater than N1, forming with substrate 201 the junction of a diode SD'. Wells 205 and 207 substantially have the same depth and have a common side. A thin heavily-doped P-type layer 213 (P+) is formed at the surface of wells 205 and 207 so that photosite PD' and diode SD' are of pinned type. The read area of pixel 200 comprises, adjacent to well 207, on the side of well 207 opposite to well 205, a region 211 formed at the surface of substrate 201 and more heavily N-type doped (N+) than wells 205 and 207.

An insulated vertical electrode 203 extends in the substrate down to a depth greater than that of wells 205 and 207, between wells 205 and 207, at the level of their common side. Electrode 203 insulates well 205 from well 207, except in a charge transfer area 204 where electrode 203 comprises an opening extending along its entire height and connecting well 205 to well 207. Electrode 203 has, in top view, a U shape delimiting most of three sides of well 207, the horizontal line of the U being located at the level of the side common to well 205 and 207.

Another insulated vertical electrode 209 extends in the substrate between well 207 and reading region 211, at the level of their common side, down to a depth greater than that of well 207. Electrode 209 insulates well 207 from region 211, except at the level of a charge transfer area 206 where electrode 209 comprises an opening extending along its entire height and connecting well 207 to region 211. Electrode 209 has the shape of a vertical plane delimiting most of the side of well 207 adjacent to region 211 (that is, the side of well 207 opposite to transfer area 204).

Another insulated vertical electrode 202 extending down to a depth at least equal to that of well 205 laterally delimits most of the three sides of well 205 which are not delimited by electrode 203.

Electrodes 202, 203, and 209 and region 211 are connected by metallizations (not shown), respectively to a node Vp, to nodes TG1 and TG2, and to a node SN connected or coupled to a read circuit. Read circuit (FIG. 1A) comprises a transistor 213 connecting node SN to a high power supply rail $V_{DD}$ of the sensor, a transistor 215 assembled as a source follower, having its gate connected to node SN, and having its drain connected to rail $V_{DD}$, and a transistor 217 connecting the source of transistor 215 to a reading line 219 of an array network comprising pixel 200. The gate of transistor 213 is connected to a node RST of application of a signal for resetting region 211, and the gate of transistor 217 is connected to a node RS of application of a pixel selection signal 200. Transistors 213, 215, and 217 are formed in a P-type doped well 220 (PW), laterally delimited by an insulating region 221.

In charge accumulation or integration phase, nodes Vp and TG1 are at a same low voltage in the order of −1 V. Such a biasing of electrodes 202 and 203 causes an accumulation of holes along the walls of the vertical trenches delimiting the photosensitive area. Holes also accumulate in transfer area 204, thus blocking electron exchanges between wells 205 and 207. Since substrate 201 is biased to the ground voltage, a potential well forms in well 205, which, in the absence of illumination, depends on the doping levels and on the bias voltages of the electrodes and of the substrate. When photodiode PD' is illuminated, electron/hole pairs are photogenerated in the photodiode, and the photogenerated electrons are attracted towards well 205 and trapped therein.

In a phase of transfer of the photogenerated electrons accumulated in well 205 to the storage area, node TG1 is set to a high voltage such that the depletion voltage of transfer area 204 has a value greater than the maximum potential of the potential well in photodiode PD' to transfer the electrons contained in well 205 into well 207, via transfer area 204. Node VP is maintained at the low voltage. Node TG2 is also at a low voltage, which causes the accumulation of holes in transfer area 206, thus blocking electron exchanges between well 207 and region 211. Once the transfer has been performed, node TG1 is set back to the low voltage, to maintain the transferred electrons confined in well 207. At this stage, a new integration phase may start.

In read phase, the charges contained in well 207 are transferred to read area 211, via transfer area 206. To achieve this, node TG2 is set to a high voltage such that the depletion voltage in transfer area 206 has a value greater than the maximum potential of the potential well in diode SD'. Nodes Vp and TG1 are maintained at the low voltage. Once the transfer has been performed, node TG2 is set back to the low voltage.

A pixel of type in FIGS. 1A to 1G suffers from various disadvantages, especially as concerns the charge transfer from the photosensitive area to the storage area.

It would thus be desirable to have a pixel structure compatible with a global shutter control which overcomes at least some of the disadvantages of existing structures.

SUMMARY

Thus, an embodiment provides an image sensor arranged inside and on top of a semiconductor substrate, comprising a control circuit and a plurality of pixels, each pixel comprising: a photosensitive area, an elongated storage area at least five times longer than it is wide and adjacent to the photosensitive area, and a read area separated from the storage area by a portion of the substrate; a first and a second insulated vertical electrodes electrically connected to each other, extending in the substrate opposite each other, and laterally delimiting the storage area, the first electrode extending between the storage area and the photosensitive area, the second electrode comprising a bent extension opposite a first end of the first electrode, the storage area emerging onto the photosensitive area on the side of the first end and on said portion of the substrate on the side of the second end of the first electrode, the control circuit being capable of applying a first voltage to the first and second electrodes to perform a charge transfer from the photosensitive area to the storage area, and a second voltage for blocking said transfer.

According to an embodiment, each pixel further comprises a third insulated vertical electrode extending in the substrate opposite the first electrode, short of the first end and beyond the second end, and partially delimiting the photosensitive area on the side of the storage area.

According to an embodiment, the control circuit is capable of applying the second voltage to the third electrode.

According to an embodiment, each pixel further comprises at least one fourth insulated vertical electrode extending in the substrate and partially surrounding the photosensitive area.

According to an embodiment, the control circuit is capable of applying the second voltage to said at least one fourth electrode.

According to an embodiment, each pixel further comprises an insulated control gate arranged on top of and in contact with said portion of the substrate, the insulated gate extending from the read area to the storage area.

According to an embodiment, the control circuit is capable of applying a third voltage to the control gate to transfer charges from the storage area to the read area.

According to an embodiment, the substrate is doped with a first conductivity type, the read area is doped with the second conductivity type, the photosensitive area comprises a first doped well of the second conductivity type coated with a doped layer of the first conductivity type, and the storage area comprises a second doped well of the second conductivity type and at least partially coated with said doped layer of the first conductivity type.

According to an embodiment, the first well extends all the way to the second well.

According to an embodiment, the thickness of the first well is smaller than 1 μm.

According to an embodiment, the width of the storage area is in the range from 0.1 to 1 μm.

According to an embodiment, the storage area is trapezoidal and is wider on the side of the second end of the first electrode than on the side of the first end of the first electrode.

According to an embodiment, the storage area is rectangular.

According to an embodiment, the storage area comprises at least two elongated regions at least five times longer than they are wide separated from one another by at least one fifth insulated vertical electrode extending in the substrate between the first and second electrodes and having ends aligned with the ends of the first electrode.

According to an embodiment, the width of each of said at least two elongated regions of the storage area is in the range from 0.1 to 1 μm.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1A:
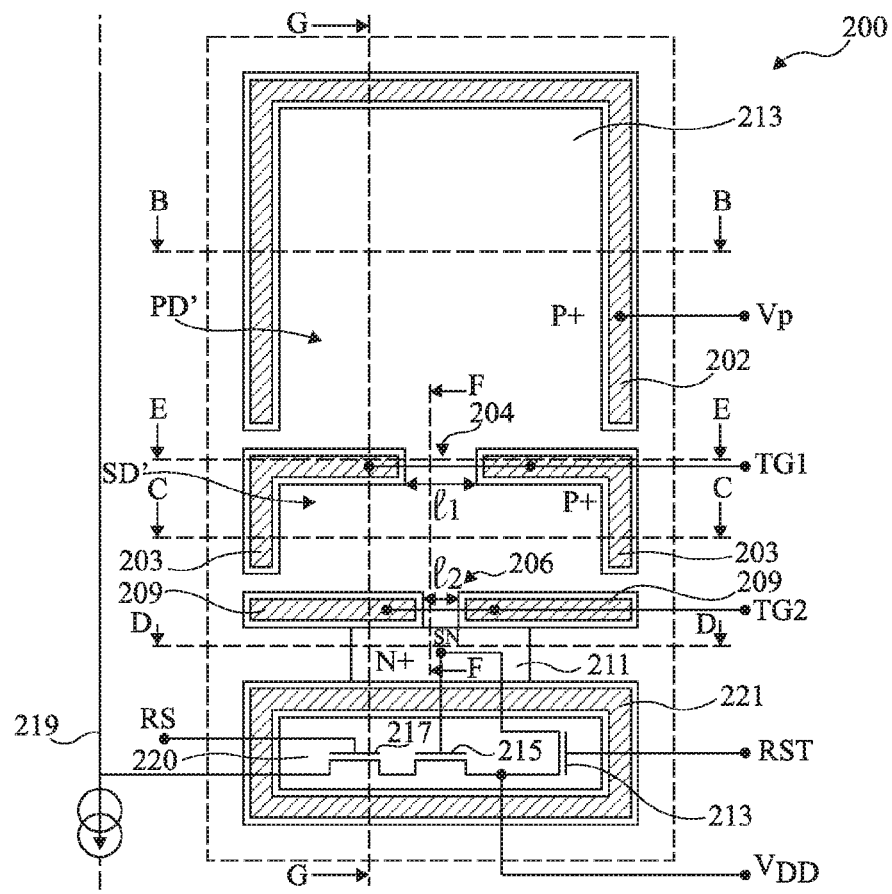
FIGS. 1A to 1G, previously described, schematically illustrate an example of a pixel compatible with a global shutter control.
Figure 1B:
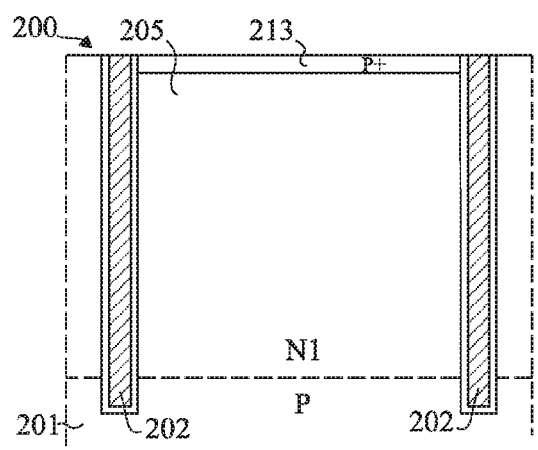
Figure 1C:
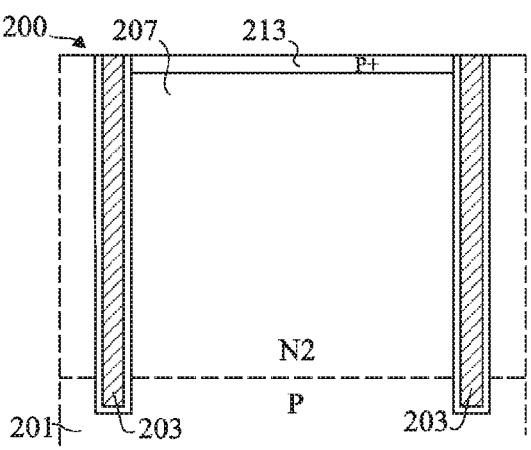
Figure 1D:
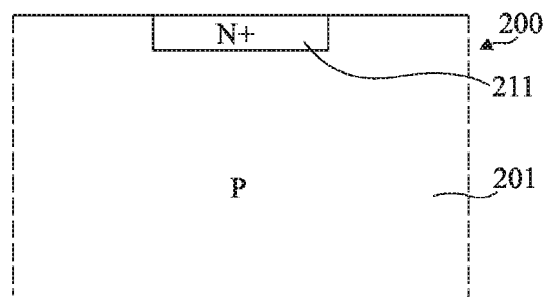
Figure 1E:
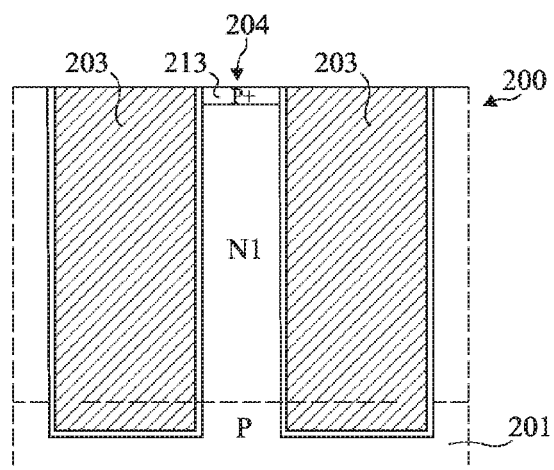
Figure 1F:
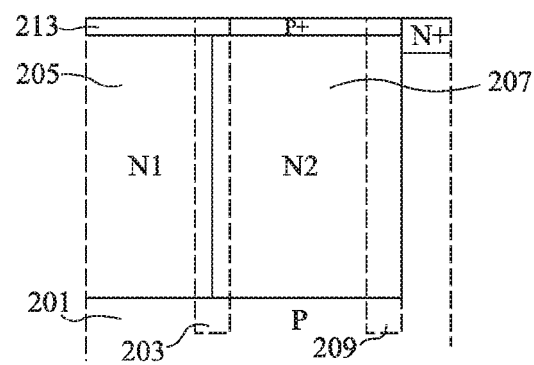
Figure 1G:
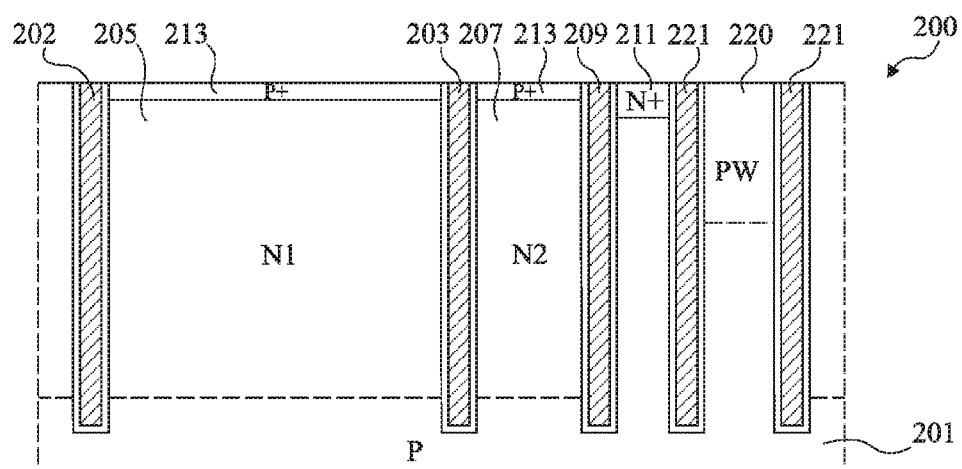

The same elements have been designated with the same reference numerals in the different drawings and, further, the various drawings are not to scale.

In the following description, terms "front", "back", "left", "right", "top", "upper", "lower", "horizontal", "vertical" refer to the orientation of the concerned elements in the corresponding drawings. Unless otherwise specified, expressions "approximately", "substantially", and "in the order of" mean to within 10%, preferably to within 5%.

Figure 2A:
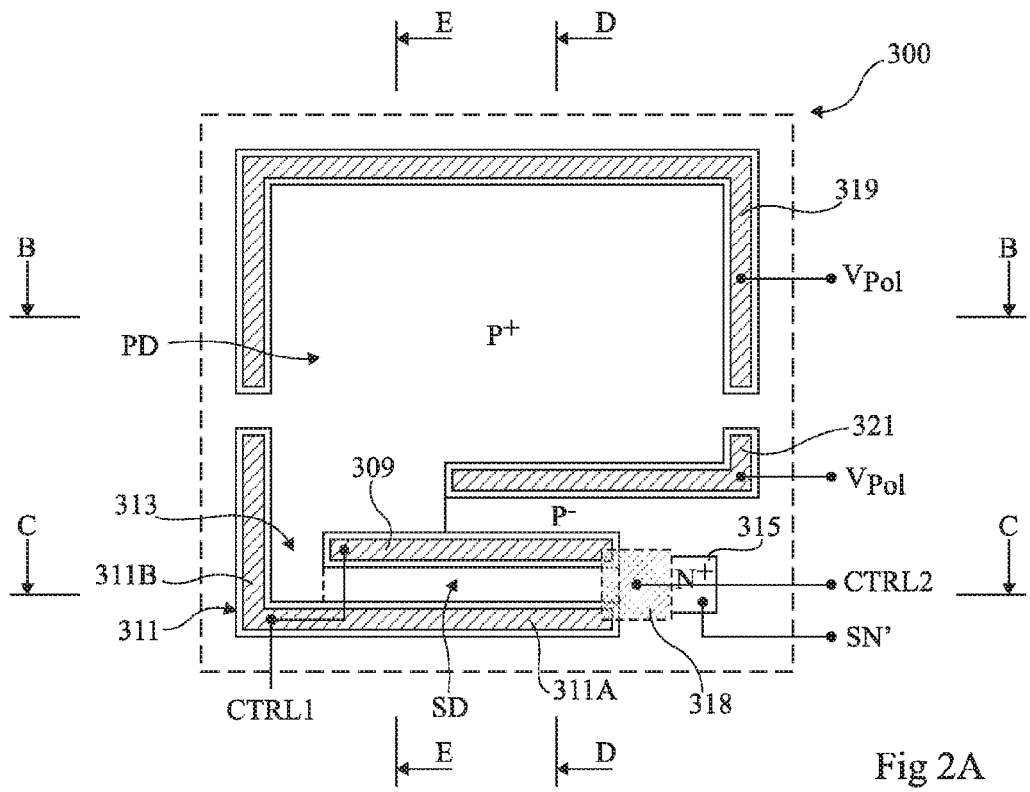
FIGS. 2A to 2E schematically illustrate an embodiment of a pixel compatible with a global shutter control.
Figure 2B:
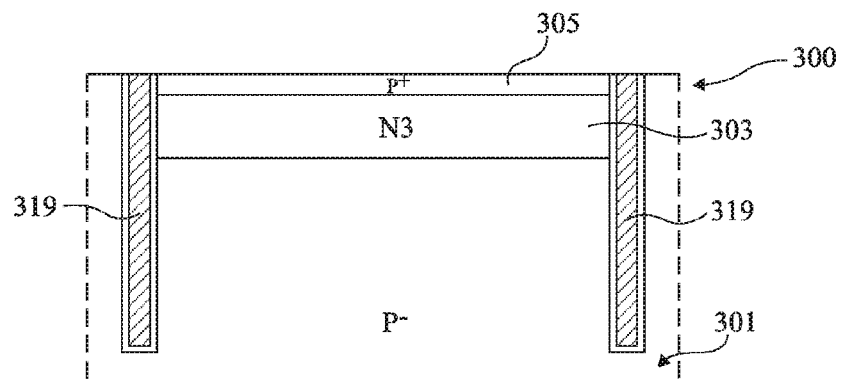
Figure 2C:
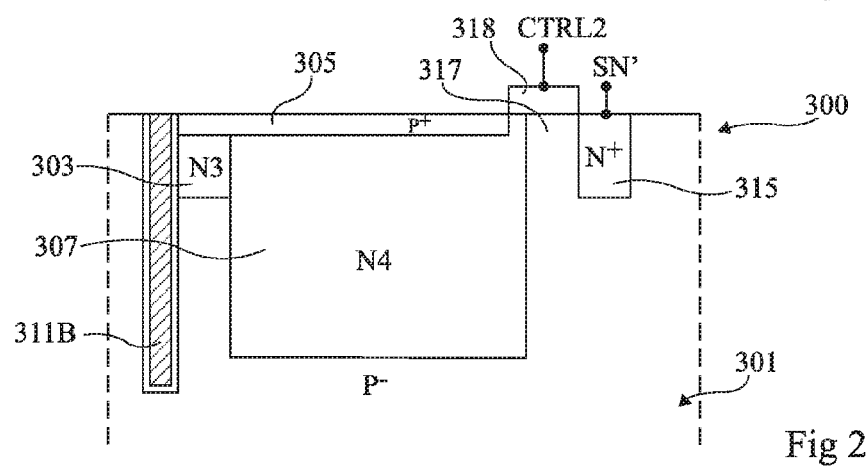
Figure 2D:
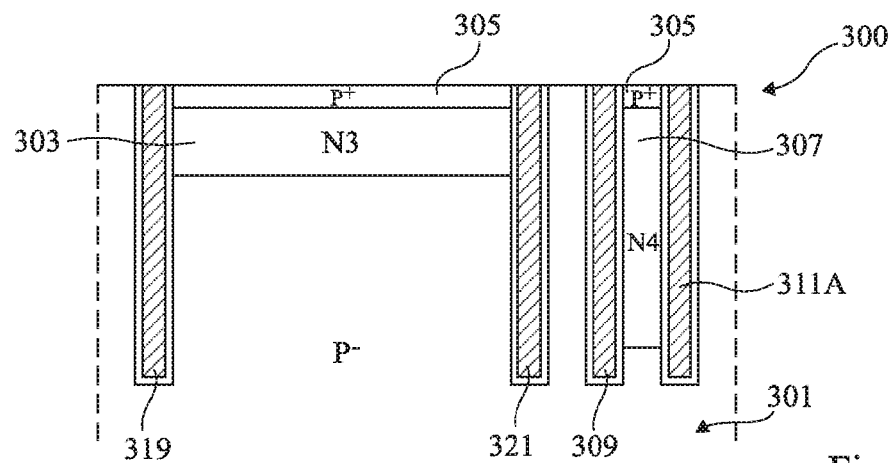
Figure 2E:
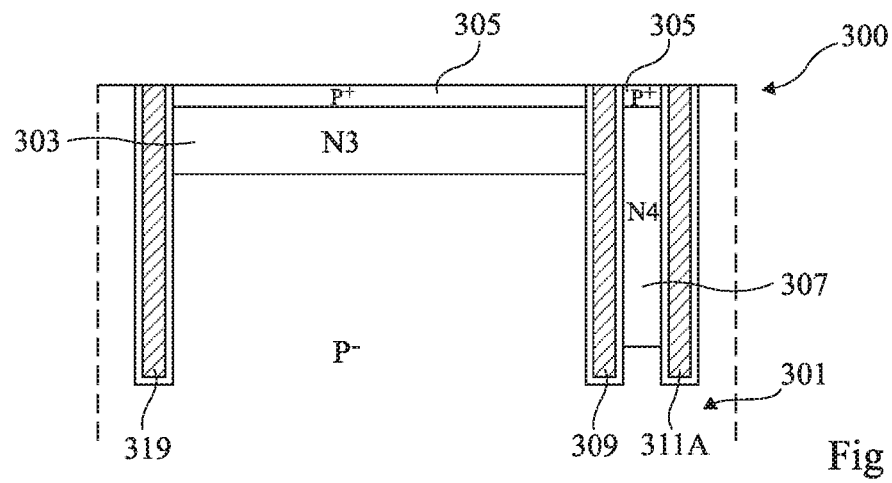

FIGS. 2A to 2E illustrate an embodiment of a pixel 300. FIG. 2A shows this pixel in top view. FIGS. 2B to 2E are cross-section views respectively along planes B-B, C-C, D-D, and E-E of FIG. 2A.

Pixel 300 is formed inside and on top of a semiconductor substrate 301, for example, made of silicon, the substrate being lightly P-type doped (P⁻) in this example. Pixel 300 comprises a photosensitive area, a charge storage area, and a read area. The pixel further comprises a read circuit (not shown) having the read area coupled or connected thereto.

The photosensitive area of pixel 300 comprises an N-type doped well or layer 303, of doping level N3, forming with substrate 301 the junction of a photodiode, or photosite, PD. Well 303 is coated, at the level of the upper surface of the substrate, with a heavily-doped P-type thin layer 305 (P⁺). Thus, photodiode PD is a vertically pinned photodiode. Well 303 is thinner than well 205 of pixel 200. In this example, well 303 is approximately parallelepipedal.

The storage area of pixel 300 comprises an N-type doped well 307, of doping level N4, forming with substrate 301 the junction of a diode SD. In this example, well 307 penetrates deeper into substrate 301 than well 303. At the upper surface level of the substrate, well 307 is coated with P⁺-type thin layer 305. Thus, diode SD is a vertically pinned diode. In top view, well 307 has the shape of a rectangle having a length at least five times greater than its width. The dimensions and doping levels N3 and N4 of wells 303 and 307 are selected so that the storage capacity of diode SD is greater than or equal to that of photodiode PD. The storage area is adjacent to the photosensitive area, more particularly to an edge of the photosensitive area, and extends lengthwise in a direction parallel to this edge. Insulated vertical electrodes 309 and 311 laterally delimit the storage area, that is, the storage area extends widthwise from electrode 309 to electrode 311. Electrodes 309 and 311 extend in the substrate down to a same depth, preferably down to a depth greater than or equal to that of well 307. Electrode 309 has the shape of a vertical section arranged between the photosensitive area and the storage area and fully delimits a first long side of the storage area. Electrode 311 comprises a portion 311A parallel to electrode 309 and at least partially opposite the latter so that portion 311A fully delimits, on the side opposite to electrode 309, a second long side of the storage area. Electrode 311 further comprises a portion or extension 311B extending all the way to the photosensitive area to be opposite a first end of electrode 309 (on the left-hand side of FIG. 2A). The end of electrode 309 and the portion of extension 311B opposite thereto define an opening 313 between the photosensitive area and the storage area. Well 303 of the photosensitive area extends through opening 313 all the way to well 307 of the storage area, well 303 extending from electrode 309 to electrode 311 at the level of opening 313.

In this embodiment, portions 311A and 311B of electrode 311 are orthogonal and electrode 311 has, in top view, an L shape. Extension 311B extends beyond opening 313 and partially delimits an edge of the photosensitive area adjacent to the edge of the photosensitive area along which the storage area extends. The storage area has the same length as electrode 309 and has short sides aligned with the ends of electrode 309. In an alternative embodiment, the storage area is shorter than electrode 309, one and/or the other of the short sides of the storage area then being recessed with respect to one and/or the other of the ends of electrode 309.

The read area of pixel 300 comprises a heavily-doped N-type region 315 ($N^+$), more heavily doped than wells 303 and 307. Region 315 extends in substrate 301 from the upper surface thereof, down to a depth smaller than that of well 307 of the storage area. Region 315 is arranged on the side of the second end of electrode 309 (on the right-hand side of FIG. 2A), opposite well 307 in the extension of the storage area. A portion 317 of the substrate separates well 307 from region 315. An insulated horizontal gate, or control gate, 318 is arranged on top of and in contact with portion 317 of the substrate. Gate 318 extends from region 315 to the storage area and forms the gate of a MOS transistor having its channel-forming region corresponding to portion 317 of the substrate and having its source and drain regions corresponding to well 307 and to region 315. In this example, gate 318 partially covers the storage area and, under gate 318, well 307 of the storage area extends down to the upper surface of substrate 301. Although this is not shown, a drain extension region may extend from region 315 under a portion of gate 318.

An insulated vertical electrode 319 delimits most of the sides of the photosensitive area which are not bordered with the storage area. In this example, electrode 319 has the shape of a U having its horizontal bar delimiting the side of the photosensitive area opposite to the side bordered with the storage area. Electrode 319 extends in substrate 301 down to a depth greater than or equal to that of well 307 of the storage area. In this example, electrode 319 extends down to the same depth as electrodes 309 and 311.

An insulated vertical electrode, or counter-electrode, 321 extends in the substrate parallel to electrode 309. Electrode 321 extends from an edge of the photosensitive area, beyond the second end of electrode 309 (on the right-hand side of FIG. 2A), to stop before the first end of electrode 309 (on the left-hand side of FIG. 2A). Electrode 321 partially delimits the photosensitive area on the side of the storage area. Electrode 321 extends in the substrate down to a depth greater than or equal to that of well 307 of the storage area, for example, down to the same depth as electrodes 309, 311, and 319. As shown in FIG. 2A, electrode 321 may have an L shape, with its long bar parallel to electrode 309 and its short bar partially delimiting the edge of the photosensitive area having the long bar extending therefrom. In this embodiment, electrode 321 is separated from electrode 319. In an alternative embodiment, the two electrodes may be joined and correspond to two portions of a same electrode.

To form electrodes 309, 311, 319, and 321, one may for example form trenches vertically extending in substrate 301 from the front surface thereof, according to a pattern corresponding to the desired electrode shape. The lateral walls and the bottom of the trenches may be coated with an insulating material, for example comprising silicon oxide, after which the trenches are filled with a conductive material. As an example, the conductive filling material may be heavily-doped polysilicon or a metal selected from the group comprising copper and tungsten.

Metallizations (not shown) electrically connect the upper surfaces of electrodes 309 and 311 to a node CTRL1, the upper surfaces of electrodes 319 and 321 to a node $V_{Pol}$, gate 318 to a node CTRL2, and the upper surface of region 315 to a node SN'. As an example, the read circuit of pixel 300 is the same as that of pixel 200, the read circuit then being connected to node SN' of pixel 300 in the same way as to node SN of pixel 200. The control voltages applied to nodes CTRL1 and CTRL2 of each sensor pixel are for example provided by a sensor control circuit.

Pixel 300 of FIGS. 2A to 2E is intended to receive an illumination on the upper surface or front surface side of substrate 301. Although this is not shown, pixel 300 comprises an opaque screen, for example, metallic, located on its upper surface side masking the entire surface of the storage area. As an example, the opaque screen masks the entire surface of the pixel except for the photosensitive area thereof.

An example of an operating mode of pixel 300 will now be described.

In integration phase, nodes $V_{Pol}$ and CTRL1 are at a same reference voltage. This voltage may be the ground voltage, or may be negative with respect to ground, for example, in the order of −1 V. Such a biasing of electrodes 309, 311, 319, and 321 causes an accumulation of holes along the walls of these electrodes. Holes also accumulate along the walls of opening 313. The depletion voltage of well 303 at the level of opening 313 is lower, for example, close to 0 V, than the depletion voltage of wells 303 and 307, which blocks electron exchanges between wells 303 and 307. Substrate 301 is also biased to a reference voltage, for example, the ground voltage. The dimensions of opening 313, the dimensions of wells 303 and 307, and the doping levels of regions 305, 303, 307, 313, and 301 are selected so that, in the absence of illumination and after the charges have been transferred, wells 303 and 307 are fully depleted, in particular at the level of opening 313. As a result, a potential well forms in well 303 and a potential well formed in well 307, which depend on the doping levels and on the bias voltages of the electrodes and of the substrate. When photodiode PD is illuminated, electron/hole pairs are photogenerated in the photodiode, and the photogenerated electrons are attracted towards well 303 and trapped therein.

In a phase of transfer of the photogenerated electrons accumulated in well 303 of photodiode PD to well 307 of the storage area, node CTRL1 is set to a sufficiently high voltage, for example, between 2 and 4 V, to set the depletion voltage of well 303 at the level of opening 313 to a voltage greater than the maximum potential of the potential well in photodiode PD during the integration phase. This causes the transfer of all the photogenerated electrons contained in well 303 to well 307, via opening 313. During the transfer phase, node $V_{Pol}$ remains at the same reference voltage as during the integration phase. Gate 318 (node CTRL2) is set to a voltage such that the corresponding MOS transistor is in an off state.

Advantageously, the transfer is eased when extension 311B of electrode 311 partially delimits one of the edges of the photosensitive area, as shown in FIG. 2A. Indeed, the photogenerated electrons accumulated in the photosensitive area are then attracted towards extension 311B which guides them towards the storage area.

An advantage of pixel 300 of FIGS. 2A to 2E over pixel 200 of FIGS. 1A to 1F is that the presence of counter-electrode 321 biased to the reference voltage during the transfer avoids for the photogenerated electrons present in the photosensitive area to reach the walls of electrode 309 and to recombine with holes trapped in interface defects. This enables to eliminate the risk of loss of charge during the transfer, conversely to the case of pixel 200 of FIGS. 1A to 1F, where, during the transfer, the photogenerated electrons present in the photosensitive area are attracted towards electrode 203.

Once the transfer has been performed, during a storage phase, node CTRL1 is set back to the same low voltage as node $V_{Pol}$ to maintain the transferred electrons confined in the potential well of well 307, before a subsequent transfer to read area 315. At this stage, photodiode PD comprises no photogenerated charge (that is, it is in a reset state), and a new integration phase may start.

In read phase, the electrons contained in the storage area are transferred to read area 315. To achieve this, gate 318 (node CTRL2) is set to a voltage, for example, between 2 and 4 V, such that the corresponding MOS transistor is in a conductive state. During the transfer, nodes $V_{Pol}$ and CTRL1 are maintained at the same reference voltage of low value as during the integration phase. Once the transfer has been performed, gate 318 is set back to the voltage blocking the corresponding MOS transistor. At this stage, diode SD comprises no photogenerated charge (that is, it is in a reset state). To favor the charge transfer from the storage area to the read area, in an alternative embodiment, it is provided for well 307 to be more heavily N-type doped on the side of its upper surface than on the side of its lower surface.

One of the advantages of pixel 300 over pixel 200 will now be described in relation with FIGS. 3A and 3B.

Figure 3A:
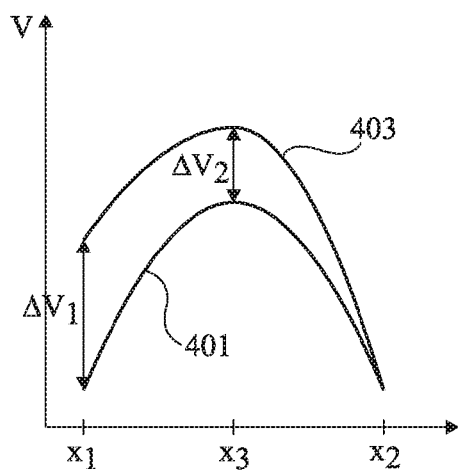
FIGS. 3A and 3B illustrate the shape of the voltage in a storage area respectively of the pixel of FIGS. 1A to 1G and of the pixel of FIGS. 2A to 2E.

In FIG. 3A, the shape of voltage V in the storage area of pixel 200 is illustrated by a curve 401 during an accumulation phase, and by a curve 403 at the beginning of a transfer phase. More specifically, each of these curves illustrates the shape of the voltage along an axis included in cross-section plane G-G of FIG. 1A, between a position $x_1$ corresponding to the interface between electrode 203 and well 207, and a position $x_2$ corresponding to the interface between electrode 209 and well 207.

Curve 401 is then obtained while the storage area comprises no charges and electrodes 203 and 209 are biased to −1 V. As previously indicated, a potential well then forms in the storage area having a maximum value in a central portion of the storage area (position $x_3$). Curve 403 is obtained while the storage area still comprises no charges, electrode 203 is biased to 2.6 V and electrode 209 remains biased to −1 V. The increase of the bias voltage of electrode 203 causes an increase $\Delta V1$ of the voltage at position $x_1$, and an increase $\Delta V2$ of the voltage at position $x_3$. However, since electrode 209 remains biased to −1 V, the voltage at position $x_2$ remains the same as during the accumulation phase. As a result, voltage increase $\Delta V2$ is smaller than voltage increase $\Delta V1$. To obtain an increase $\Delta V1$ of the voltage at position $x_3$, electrode 203 should be biased to more than 2.6 V.

Figure 3B:
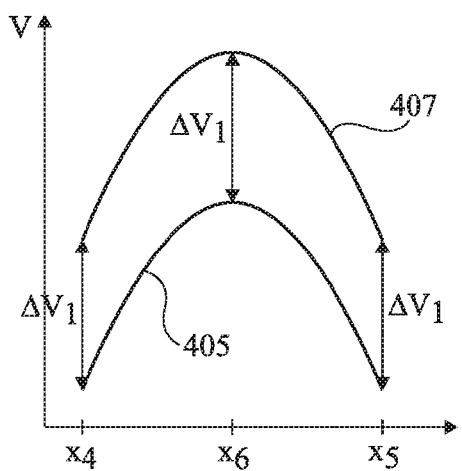

In FIG. 3B, the shape of voltage V in the storage area of pixel 300 is illustrated by a curve 405 during an accumulation phase, and by a curve 407 at the beginning of a transfer phase. More specifically, each of these curves illustrates the shape of the voltage along an axis included in cross-section plane D-D of FIG. 2A, between a position $x_4$ corresponding to the interface between electrode 309 and well 307 and a position $x_5$ corresponding to the interface between electrode 311 and well 307. Curve 405 is obtained while the storage area comprises no charges and electrodes 309 and 311 are biased to −1 V. A potential well forms in the storage area, and has its maximum value in a central portion of the storage area (position $x_6$). Curve 407 is obtained while the storage area still comprises no charges and electrodes 309 and 311 are biased to 2.6 V. The increase of the bias voltage of electrodes 309 and 311 causes an increase $\Delta V1$ of the voltage at positions $x_4$ and $x_5$ and, conversely to the case of pixel 200, an increase $\Delta V1$ of the voltage at position $x_6$ can be observed.

Thus, advantageously, to obtain a potential well of a given thickness sufficient to trap all the charges transferred from the photosensitive area to well 307 of the storage area, the bias voltage of electrodes 309 and 311 is lower than that of electrode 203 of pixel 200. This advantage results from the fact that, in pixel 300, the storage area is narrow and all the insulated vertical electrodes in contact with the storage area are electrically interconnected.

Another advantage of pixel 300 of FIGS. 2A to 2E over pixel 200 of FIGS. 1A to 1G will now be described.

Figure 4A:
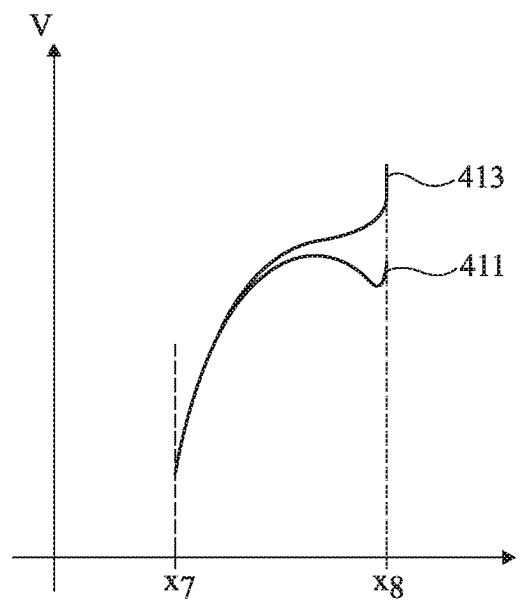
FIGS. 4A and 4B illustrate the shape of the voltage in a photosensitive area respectively of the pixel of FIGS. 1A to 1G and of the pixel of FIGS. 2A to 2E.

In FIG. 4A, the shape of voltage V in well 205 of pixel 200 during a transfer phase is illustrated by a curve 411 when electrode 203 is biased to 2.6 V, and by a curve 413 when the electrode is biased to 4.1 V, electrode 202 being biased to −1 V. More particularly, each of these curves illustrates the shape of the voltage along an axis included in cross-section plane F-F of FIG. 1A, between a position $x_7$ corresponding to the interface between electrode 202 and well 205, and a position $x_8$ at the level of transfer area 204.

As can be seen in FIG. 4A, when electrode 203 is biased to 2.6 V (curve 411), the voltage in well 205 does not monotonously increase all the way to the transfer area (position $x_8$). As a result, at the end of a transfer phase, there remain electrons photogenerated during the accumulation phase in the photosensitive area. An unwanted lag phenomenon can then be observed between two successive pixel read phases. Electrode 203 should be biased to 4.1 V (curve 413) so that the voltage in well 205 monotonously increases all the way to transfer area 204 (position $x_8$) and that all the photogenerated electrons accumulated in the photosensitive area are effectively transferred to the storage area. The use of such a high biasing is not desirable.

Figure 4B:
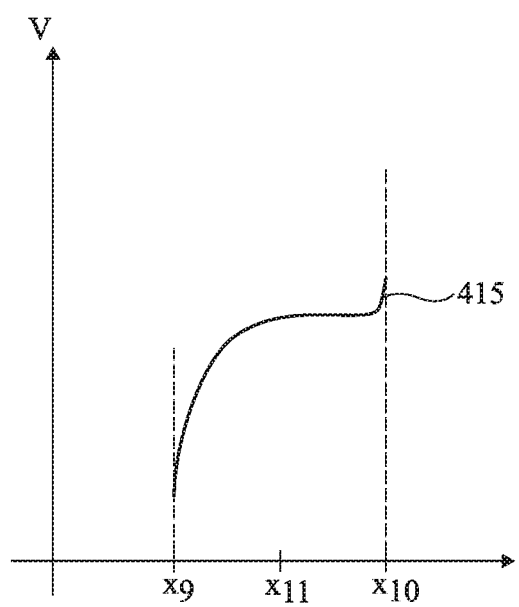

In FIG. 4B, the shape of voltage V in well 303 of pixel 300 is illustrated by a curve 415 corresponding to the case of curve 411 of FIG. 4A, that is, when electrodes 309 and 311 are biased to 2.6 V and electrode 319 is biased to −1 V. The curve illustrates the shape of the voltage along an axis parallel to cross-section plane E-E of FIG. 2A, between a position $x_9$ corresponding to the interface between electrode 319 and well 303 and a position $x_{10}$ at the level of opening 313.

As shown in FIG. 4B, the voltage monotonously increases all the way to opening 313 (position $x_{10}$) whereby all the electrons are transferred to the storage area.

Thus, advantageously, the minimum bias voltage of electrodes 309 and 311 to suppress remanence phenomena in pixel 300 is lower than that of electrode 203 of pixel 200. This advantage results from the fact that well 303 of the photosensitive area is thinner than well 205 of the photosensitive area of pixel 200, and, more particularly, due to the fact that the thickness of well 303 is selected so that, in the absence of illumination, the value of the potential well in a central portion of well 303 (position $x_{11}$) only depends on the doping levels and is independent from the biasing conditions of electrodes 309, 311, 319, and 321.

As an example, pixel 300 of FIGS. 2A to 2E may have the following dimensions:

a length between 1 and 6 μm, for example, 3 μm, and a width between 1 and 4 μm, for example, 2 μm, for a photosensitive area which is rectangular in top view and extends lengthwise in the same direction as the storage area, a length between 1 and 6 μm, for example, 2 μm, and a width between 0.2 and 1 μm, for example, 0.3 μm, for the storage area, a length between 1 and 6 μm, for example, 2 μm, for portion 311A of electrode 311, a length between 0.5 and 1.5 μm, for example, 0.8 μm, for extension 311B of electrode 311, a length between 1 and 6 μm, for example, 1.8 μm, for electrode 309, from 0.1 to 1 μm, for example, 0.2 μm, between the first end of electrode 309 and extension 311B opposite thereto, from 0.1 to 0.4 μm, for example, 0.275 μm, between the storage area and region 315 of the read area, from 0 to 100 nm, for example, 50 nm of recess of the storage area with respect to the first end of electrode 309, from 0 to 100 nm of recess, for example, 70 nm of recess of the storage area with respect to the second end of electrode 309, a thickness between 0.2 and 1 μm, for example, 0.5 μm for well 303, a thickness between 1 and 10 μm, and preferably between 2 and 4 μm, for well 307, a thickness between 0.1 and 0.5 μm for region 315, a thickness between 100 and 300 nm, for example, 200 nm, for $P^+$-type doped thin layer 305, and a depth between 1 and 10 μm, preferably between 2 and 5 μm, and a width between 0.1 and 0.5 μm for the insulated vertical electrodes.

As an example, for a given manufacturing technology, the doping levels of the various regions of pixel 300 are the following:

from $10^{17}$ to $10^{19}$ at·cm$^{-3}$, for example, $10^{18}$ at·cm$^{-3}$, for thin layer 305, from $10^{16}$ to $10^{18}$ at·cm$^{-3}$, for example, $10^{17}$ at·cm$^{-3}$, for well 303, from $10^{16}$ to $10^{19}$ at·cm$^{-3}$, for example, $10^{17}$ at·cm$^{-3}$, for well 307, from $10^{19}$ to $10^{22}$ at·cm$^{-3}$, for example, $10^{21}$ at·cm$^{-3}$, for region 315, and from $10^{14}$ to $10^{16}$ at·cm$^{-3}$, for example, $10^{15}$ at·cm$^{-3}$, for well 301.

Figure 5A:
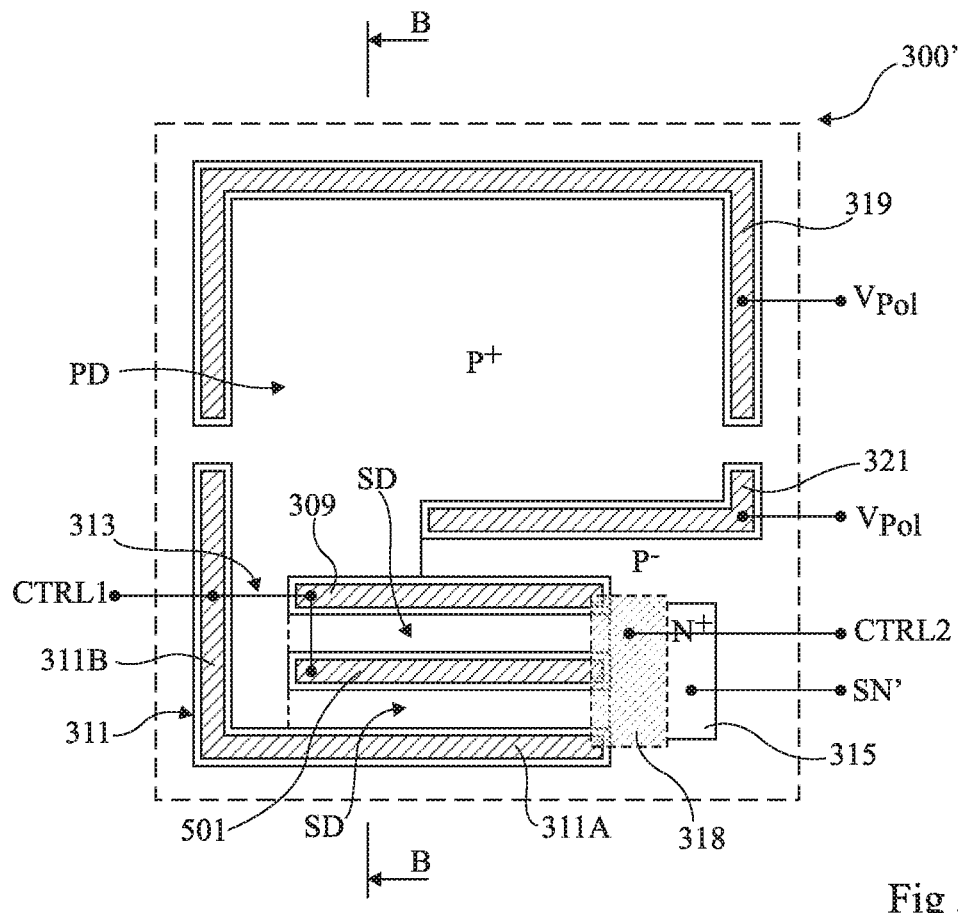
FIGS. 5A and 5B schematically illustrate an alternative embodiment of the pixel of FIGS. 2A to 2E.
Figure 5B:
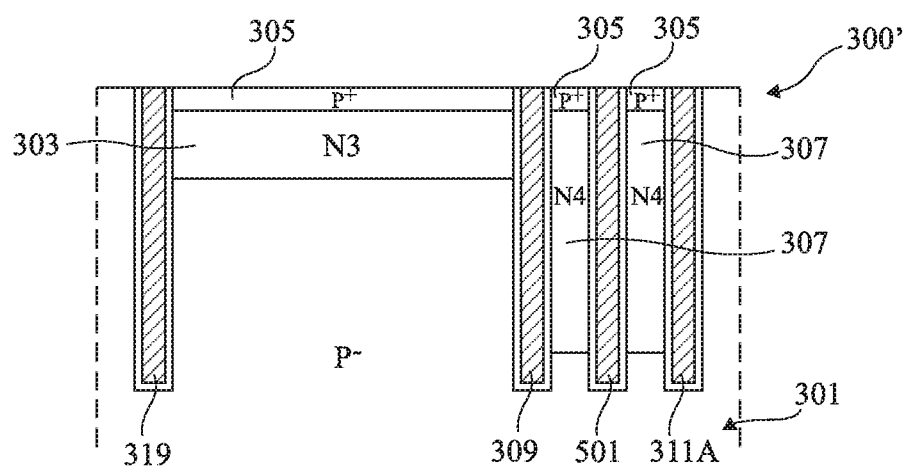

FIGS. 5A and 5B schematically show a pixel 300' corresponding to an alternative embodiment of pixel 300 of FIGS. 2A to 2E. FIG. 5A shows pixel 300' in top view and FIG. 5B corresponds to a cross-section view along plane B-B of FIG. 5A.

Pixel 300' comprises same elements as pixel 300 and is similar thereto, with the difference that it further comprises an insulated vertical electrode 501 arranged between electrode 309 and portion 311A of electrode 311. Electrode 501 has substantially the same dimensions as electrode 319 and extends in well 307 and substrate 301, parallel and opposite to electrode 309. The interval between the opposite surfaces of electrodes 309 and 501 and between the opposite surfaces of electrode 501 and of portion 311A of electrode 311 is substantially the same as the interval between the opposite surfaces of electrodes 309 and 311 in pixel 300. Electrode 501 is electrically connected to electrodes 309 and 311, that is, to node CTRL1, by metallizations, not shown.

Thus, the storage area of pixel 300' comprises two rectangular areas, or regions, corresponding to two storage areas of pixel 300 placed side by side and simultaneously controlled by signal CTRL1. This enables to double the storage capacity of the storage area of pixel 300' with respect to that of pixel 300. Further, each of the two rectangular areas of the storage area of pixel 300' having the same dimensions as the storage area of pixel 300, the advantage of the storage area of pixel 300 described in relation with FIGS. 3A and 3B remains valid for each of the rectangular areas of the storage area of pixel 300'. In alternative embodiments of pixel 300', it may be provided for the storage area to comprise more than two rectangular areas by arranging other electrodes 501 between electrodes 309 and 311.

Specific embodiments have been described. Various alterations, modifications, and improvements will occur to those skilled in the art. The shape of electrodes 309, 311, 319, 321, and 501 in top view (FIGS. 2A and 5A) are indicative and may be adapted by those skilled in the art to improve charge transfers and or to decrease the pixel surface area. In particular, although a rectangular storage area has been described, said area may have any desirable elongated shape, for example, a trapezoidal shape. In this last case, the storage area is wider at the level of its second end, on the side of the read area, than at the level of its first end, on the side of the photosensitive area, to favor the charge transfer from the transfer area to the read area. As an example, for a storage area having a length in the range from 1 to 6 μm, the storage area may be wider by from 0.1 to 0.5 μm on the side of its second end than on the side of its first end. In the alternative embodiment of FIGS. 5A and 5B, it may also be provided for the storage area to comprise at least two trapezoidal regions.

Further, the described embodiments may be adapted to other structures of a pixel with insulated vertical electrodes. In particular, it will be within the abilities of those skilled in the art to adapt the described embodiments to add thereto an anti-dazzle system, for example, such as that described in patent U.S. Pat. No. 9,236,407, enabling to avoid, in case of a saturation of the photosensitive area during an accumulation phase, for an excess of photogenerated charges to pour into the storage area. It will also be within the abilities of those skilled in the art to adapt the described embodiments to sensors where a plurality of pixels share a same read area and/or a same read circuit. Further, well 303 of the photosensitive area may have substantially the same depth as well 307 of the storage area.

Embodiments where counter-electrode 321 is of same nature as electrode 319 have been described. Counter-electrode 321 may also be replaced with a wall of an insulating material coated with a heavily-doped P-type layer (P$^+$) or with a heavily-doped P-type semiconductor wall (P$^+$). Electrode 321 may also be replaced with an insulating wall coated with a heavily-doped P-type layer.

It will be within the abilities of those skilled in the art to adapt the described embodiments to pixel structures where all the conductivity types are inverted with respect to the above-mentioned examples.

The described embodiments are not limited to the example of read circuit shown in FIG. 1A and it will be within the abilities of those skilled in the art to obtain the desired operation by using other read circuits.

Although pixels intended to receive an illumination on the front surface side of the substrate have been described, it will be within the abilities of those skilled in the art to adapt the described embodiments to the case of pixels intended to receive an illumination from the rear surface of the substrate. As an example, in the case of an illumination from the rear surface of the substrate, the opaque screen covering the storage area will be arranged on the side of this rear surface, and, further, the substrate may be thinned from its rear surface all the way to the insulated vertical electrodes.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An image sensor including a plurality of pixels, each pixel comprising:
a semiconductor substrate including a photosensitive area, an elongated storage area having a width and a length at least five times longer than the width and positioned adjacent to the photosensitive area, and a read area separated from the elongated storage area by a portion of the semiconductor substrate;
a first insulated vertical electrode and a second insulated vertical electrode electrically connected to each other, extending in the semiconductor substrate opposite each other, and laterally delimiting the elongated storage area, the first insulated vertical electrode extending between the elongated storage area and the photosensitive area, the second insulated vertical electrode comprising a bent extension opposite a first end of the first insulated vertical electrode, the elongated storage area emerging onto the photosensitive area on the side of the first end and on said portion of the semiconductor substrate on the side of the second end of the first insulated vertical electrode,
wherein the first and second insulated vertical electrodes are configured to receive a first voltage which permits a charge transfer from the photosensitive area to the elongated storage area, and receive a second voltage which blocks said charge transfer.

2. The image sensor of claim 1, wherein each pixel further comprises a third insulated vertical electrode extending in the semiconductor substrate opposite the first insulated vertical electrode, short of the first end and beyond the second end, and partially delimiting the photosensitive area on the side of the elongated storage area.

3. The image sensor of claim 2, wherein the third insulated vertical electrode is configured to receive the second voltage.

4. The image sensor of claim 1, wherein each pixel further comprises at least one fourth insulated vertical electrode extending in the semiconductor substrate and partially surrounding the photosensitive area.

5. The image sensor of claim 4, wherein said at least one fourth insulated vertical electrode is configured to receive the second voltage.

6. The image sensor of claim 1, wherein each pixel further comprises an insulated control gate arranged on top of and in contact with said portion of the semiconductor substrate, the insulated control gate extending from the read area to the elongated storage area.

7. The image sensor of claim 6, wherein the insulated control gate is configured to receive a third voltage which permits transfer of charge from the elongated storage area to the read area.

8. The image sensor of claim 1, wherein the semiconductor substrate is doped with a first conductivity type, the read area is doped with the second conductivity type, the photosensitive area comprises a first doped well of the second conductivity type coated with a doped layer of the first conductivity type, and the elongated storage area comprises a second doped well of the second conductivity type and at least partially coated with said doped layer of the first conductivity type.

9. The image sensor of claim 8, wherein the first doped well extends to contact the second doped well.

10. The image sensor of claim 8, wherein a thickness of the first doped well is smaller than 1 µm.

11. The image sensor of claim 1, wherein the width of the elongated storage area is in a range from 0.1 to 1 µm.

12. The image sensor of claim 1, wherein the elongated storage area is trapezoidal and is wider on a side of the second end of the first insulated vertical electrode than on a side of the first end of the first insulated vertical electrode.

13. The image sensor of claim 1, wherein the elongated storage area is rectangular.

14. The sensor of claim 1, wherein the elongated storage area comprises at least two elongated regions each having widths and each having lengths that are at least five times longer than the widths, said two elongated regions separated from each other by at least one fifth insulated vertical electrode extending in the substrate between the first and second insulated vertical electrodes and having ends aligned with the ends of the first insulated vertical electrode.

15. The image sensor of claim 14, wherein the width of each of said at least two elongated regions of the elongated storage area is in the range from 0.1 to 1 µm.

16. An image sensor pixel, comprising:
a semiconductor substrate including a photosensitive area, an elongated storage area having a width and a length at least five times longer than the width and positioned adjacent to the photosensitive area, and a read area separated from the elongated storage area by a portion of the semiconductor substrate;
a first insulated vertical electrode and a second insulated vertical electrode that are electrically connected to each other and extend in the semiconductor substrate opposite each other, wherein the first and second insulated vertical electrodes laterally delimit the elongated storage area with the first insulated vertical electrode extending between the elongated storage area and the photosensitive area;
wherein the second insulated vertical electrode includes a bent extension opposite a first end of the first insulated vertical electrode; and wherein the elongated storage area emerges onto the photosensitive area at the first end and on said portion of the semiconductor substrate at the second end of the first insulated vertical electrode.

17. The image sensor of claim 16, wherein the pixel further comprises a third insulated vertical electrode extending in the semiconductor substrate opposite the first insulated vertical electrode, short of the first end and beyond the second end, and partially delimiting the photosensitive area at the elongated storage area.

18. The image sensor of claim 17, wherein the pixel further comprises at least one fourth insulated vertical electrode extending in the semiconductor substrate and partially surrounding the photosensitive area.

19. The image sensor of claim 16, wherein the pixel further comprises an insulated control gate arranged on top of and in contact with said portion of the semiconductor substrate, the insulated control gate extending from the read area to the elongated storage area.

20. The sensor of claim 16, wherein the elongated storage area comprises at least two elongated regions each having widths and each having lengths that are at least five times longer than the widths, said two elongated regions separated from each other by at least one fifth insulated vertical electrode extending in the substrate between the first and second insulated vertical electrodes and having ends aligned with the ends of the first insulated vertical electrode.

* * * * *